(12) United States Patent
Wang et al.

(10) Patent No.: US 8,667,450 B2
(45) Date of Patent: Mar. 4, 2014

(54) VALIDATION OF INTEGRATED CIRCUIT DESIGNS BUILT WITH ENCRYPTED SILICON IP BLOCKS

(75) Inventors: Tongsheng Wang, Milpitas, CA (US); Weidong Zhang, San Ramon, CA (US)

(73) Assignee: Encrip, Inc., San Ramon, CA (US)

( * ) Notice: Subject to any disclaimer, the term of this patent is extended or adjusted under 35 U.S.C. 154(b) by 0 days.

(21) Appl. No.: 13/470,653

(22) Filed: May 14, 2012

(65) Prior Publication Data

US 2013/0305194 A1 Nov. 14, 2013

(51) Int. Cl.
*G06F 17/50* (2006.01)

(52) U.S. Cl.
USPC .......................................... 716/136; 716/137

(58) Field of Classification Search
USPC .................................. 716/136, 137
See application file for complete search history.

(56) References Cited

U.S. PATENT DOCUMENTS

| | | | |
|---|---|---|---|
| 7,222,312 B2 * | 5/2007 | Ferguson et al. | 705/51 |
| 8,302,039 B2 * | 10/2012 | Ferguson et al. | 716/100 |
| 2008/0208886 A1 * | 8/2008 | Zhang | 707/102 |
| 2010/0199107 A1 * | 8/2010 | Ferguson et al. | 713/189 |
| 2011/0119645 A1 * | 5/2011 | Koizumi | 716/102 |

\* cited by examiner

*Primary Examiner* — Vuthe Siek
*Assistant Examiner* — Mohammed Alam
(74) *Attorney, Agent, or Firm* — James Cai; Schein & Cai LLP

(57) ABSTRACT

A method and system for validating integrated circuit designs that are built with encrypted silicon IP blocks decrypts the encrypted silicon IP blocks in the integrated circuit designs with the keys from IP providers. After decryption, various validation checks on the integrated circuit designs are done, such as design rule check (DRC), layout versus schematic (LVS) check, parasitic resistor capacitor (RC) extraction, circuit simulation, signal electro migration (EM) and voltage drop check, signal integrity (SI) check and static timing check, etc. After validation, any confidential data from the checking results related to the encrypted silicon IP blocks are themselves encrypted to protect the proprietary silicon IP blocks. The method and system work with silicon IP encryption technology to establish a low cost silicon IP usage and verification platform, and to enable a more cost efficient silicon IP business model.

17 Claims, 8 Drawing Sheets

VALIDATION OF INTEGRATED CIRCUIT DESIGNS BUILT WITH ENCRYPTED SILICON IP BLOCKS

BACKGROUND OF THE PRESENT INVENTION

I. Technical Field

The present invention relates to validating integrated circuit designs built with encrypted silicon IP blocks. Furthermore, the present invention relates to establishing a low cost silicon IP usage and verification platform.

II. Background

Modern electronics circuit designs are now so complex that circuit designers had to resort to computer system-aided design tools to complete the circuit designs in reasonable time frames. Once a design is committed to silicon production, it's too late and too expensive to even consider not getting it right the first time. In the past, the first production prototypes were debugged in target hardware. Now with computer system aided design tools, the circuits can be simulated and checked while still only manifested as software in design files.

As recently as 20-30 years ago, whole functional parts like printer controllers, direct memory access controllers, serial data input/output units, and microprocessors were individually packaged integrated circuit (IC) chips that could be wired together on printed circuit boards (PCB's). These IC chips could be freely selected from various manufacturers. Each chip included an implied license for purchase and use by anyone.

Nowadays the consumer electronic market requests system electronic companies to deliver more compact, more functional, and more power efficient and cost effective devices. To meet the new demand, system electronic companies no longer integrate individual chips on PCB's to build the devices, but instead adopt a new methodology, called as system on chip (SOC), to design and manufacture chips to build the devices. As a result, system electronic companies request other electronic companies to provide silicon intellectual property (IP) blocks to be integrated in their chip circuit designs.

Silicon IP is now widely used in integrated circuit designs, it has increased circuit developers' productivity and enabled them to more quickly complete designs and to focus their engineering resources on their core competencies. Silicon IP products are relatively easy to copy, forge, and re-design, because they are stored and transferred in Graphic Data System II (GDSII), Open Artwork Systems Interchange Standard (OASIS), and other standardized format layout database electronic files.

Faster easy designs made possible by silicon IP also makes strong incentives for unauthorized use, re-use, transfer or sale of these items. IP security is always a big issue and concern to Silicon IP providers. As a result, Silicon IP providers prefer to do business with big companies with good credit and high volumes in production. Otherwise, they resort to initially providing abstract type IP layouts. Then the original IP layout is substituted in replace the abstract one just before maskmaking for fabrication.

But both of the business methods have problems, for the first method, silicon IP providers compete for a very limited market, it is difficult to win business accounts and still see a good profit margin. Small semiconductor startups and design houses need the IPs, but their credit is not usually good enough, IP providers are unwilling to do business with them. When IP providers do agree to provide their IPs, small companies are required to pay expensive license fees up front, it is a big burden on their tight budgets.

For the second business method, IP providers need to do silicon fabrication, silicon testing and prepare model libraries before their IP products are released, it is a big cost to the IP providers. On the other side, the IP product customers do not like the abstract version IP layout at all, the reason is the same IP may behave differently within customer side integrated circuit design from the standalone block when it is tested on the provider side, and the IP user has no way to test it out by using his own proven verification flow. For it is expensive to make photo masks and fabricate a test chip, without a complete full chip verification, it is indeed very risky for IP product customers to use the abstract version IP in their designs.

The integrated circuit design industry is in dire need of finding a solution, so that IP providers can achieve a much broader market and provide their IP products securely to all developing stage companies, and meanwhile IP product customers (big or small) all can easily get the IPs at a low cost and verify them by using the same methodology as they use to verify their own internal blocks.

In U.S. Pat. No. 8,117,661, "Encryption based silicon IP protection", the present inventor, Weidong Zhang, describes a method and system for protecting silicon IPs from unauthorized use, transfer and sale. IP providers are enabled to protect their IP products, and to safely do business with any electronic companies. Because the IPs can be so well protected, there is little risk of IP loss. To promote their IP usage by some promising startup companies, IP providers could even provide their IP products for free, and meanwhile, if any of the startup companies could succeed, IP providers can get a huge reward later through lucrative royalty charges. The technology described can serve as a corner stone to setup a new IP usage and delivery platform. But on the other side, even though the EDA companies, such as California based Cadence Design Systems, Inc., Synopsys, Inc. and Mentor Graphics Co., all provide various verification tools to validate integrated circuit designs, there is no method or system that can verify integrated circuit designs built with encrypted silicon IP blocks.

When verifying an integrated circuit design that is built with encrypted IP blocks, the verification tools not only need to find all the design errors, which include the errors inside the encrypted silicon IP blocks, but also need to protect the circuit design and other confidential information in the encrypted silicon IP blocks. The integrated circuit design industry needs to find a method to solve the new verification requirements, so that the industry could complete to establish a low cost IP usage and verification platform, which can benefit the whole IC industry, and can promote new technologies and new startup companies. The integrated circuit industry can experience a big development with the new business platform established.

SUMMARY OF THE PRESENT INVENTION

In accordance with the present invention, a method and system are provided for validating integrated circuit designs that are built with encrypted silicon IP blocks.

Standard validations of designs require DRC (Design Rule Check), LVS (Layout Versus Schematic) check, parasitic RC (Resistor and Capacitor) extraction, circuit simulation, and other circuit validation checks, such as signal EM (Electro migration) and voltage drop check, SI (Signal Integrity) check and static timing check, etc. Embodiments of the present invention implement such validation checks on integrated circuit designs that are built with encrypted silicon IP blocks.

In an aspect of the present invention, when doing the design rule check, the method first reads and parses the DRC rule file. Then, it reads the integrated circuit layout database file and finds the encrypted structures (encrypted silicon IP blocks) and the unencrypted structures. For the encrypted structures, it uses authorized keys to decrypt the structures to get the decrypted structures. From the decrypted structures and the unencrypted structures, it extracts polygons and texts on layers. Then, it does design rule checks on the polygons and texts and finds rule violations. Finally, it writes the rule violations to a violation database, when doing the writing, the violations generated from the polygons and texts from the decrypted structures are encrypted and saved in the encryption section of the violation database.

In an aspect of the present invention, when doing the LVS check, the method first reads and parses the LVS rule file. Then it reads the integrated circuit layout database file and finds the encrypted structures (encrypted silicon IP blocks) and the unencrypted structures. For the encrypted structures, it uses authorized keys to decrypt the structures to get the decrypted structures. From the decrypted structures and the unencrypted structures, it extracts polygons and texts on layers. Then it extracts ports, nets and devices from the polygons and texts to get a layout netlist. Then it reads the schematic netlist. Finally, it compares the layout netlist with the schematic netlist and records any mismatch of the pins, nets and devices between the netlists in a report file. When doing the recording, the mismatches of the pins, nets and devices extracted from the polygons and texts from the decrypted structures are encrypted and saved in the encryption section of the report file. A further aspect of the present invention, the polygons and texts and the layout netlist generated from the polygons and texts are saved in a partially encrypted layout polygon and netlist database. When doing the saving, the polygons and texts from the decrypted structures and the netlist generated from them are encrypted and saved in the encryption section of the database.

In an aspect of the present invention, when doing the parasitic RC extraction, the method first reads and parses the extraction command file. Then it reads the layer mapping file and the technology file. Then it reads and decrypts the partially encrypted layout polygon and netlist database to get nets, devices and polygons, it marks the nets, devices and polygons from the encryption section of the database as encrypted. Then it maps the layers of the polygons from layout layers to technology layers, it extracts resisters and capacitors from the polygons on technology layers, finally it merges the resistors and capacitors with the nets and devices, and writes the result to a partially encrypted parasitic netlist. When doing the writing, the marked nets, devices and the resistors and capacitors extracted from the marked polygons are encrypted and saved in the encryption section of the parasitic netlist.

In an aspect of the present invention, when doing circuit simulation, the method first reads and parses the simulation setup file. Then it reads and decrypts the partially encrypted parasitic netlist to get a circuit network consisting of nets, devices and RCs, it marks the nets, devices and RCs from the encryption section of the parasitic netlist as encrypted. Then it reads in the model library files to get device models, finally it simulates the circuit network by applying signal waveforms on the input pins of the circuit and propagating the waveforms through the circuit network, it generates waveforms for each nets and pins of devices in the circuit network and writes the waveforms to the partially encrypted signal waveform database. When writing the results, the waveforms generated for the marked nets and devices are encrypted and saved in the encryption section of the signal waveform database.

Another aspect of the present invention includes, the method first reads and parses validation configuration files. Then it reads and decrypts the partially encrypted parasitic netlist to get a circuit network consisting of nets, devices and RCs, it marks the nets, devices and RCs from the encryption section of the parasitic netlist as encrypted. Then it performs circuit validation checks, such as signal EM and voltage drop check, SI check and static timing check, etc. Finally it writes the validation results to the partially encrypted validation report database. When writing the results, the validation results related to the marked nets and devices are encrypted and saved in the encryption section of the validation report database.

A further aspect of the present invention includes a computerized system comprising a DRC module operative to perform design rule check on an integrated circuit built with encrypted IP blocks and to generate reports. The system also includes a LVS module operative to perform LVS check and to generate reports and a partially encrypted layout polygon and netlist database. The system also includes an extraction module operative to decrypt the partially encrypted layout polygon and netlist database, and to perform parasitic RC extraction, and to generate a partially encrypted parasitic netlist. The system also includes a simulation module operative to decrypt the partially encrypted parasitic netlist, and to perform circuit simulation, and to generate waveform files and report files. The system also includes other validation module operative to decrypt the partially encrypted parasitic netlist, and to perform other validation checks, such as signal EM and voltage drop check, SI check and static timing check, etc.

A still further aspect of the present invention includes a method comprising: creating by at least one silicon intellectual property (IP) provider an original silicon IP layout database and an encrypted silicon IP layout database using a cryptographic key associated with the provider. The method includes acquiring by an electronic company the encrypted silicon IP layout database from the at least one provider; incorporating the encrypted silicon IP layout database of at least one provider into a circuit design. The method also includes applying a verification key by the electronic company from the at least one provider and passing the key to the circuit verifier, which is disclosed by the present invention, to validate the circuit design.

These and various other features as well as advantages, which characterize the present invention, will be apparent from a reading of the following detailed description and a review of the associated drawings.

BRIEF DESCRIPTION OF THE DRAWINGS

Aspects and embodiments of the disclosure will become more apparent from the detailed description set forth below when taken in conjunction with the drawings in which like reference characters identify correspondingly throughout.

DETAILED DESCRIPTION OF THE PREFERRED EMBODIMENTS

U.S. Pat. No. 8,117,661, "Encryption based silicon IP protection", issued Feb. 14, 2012, to the present inventor, Weidong Zhang, describes many of the underlying concepts, methods, and systems that can be usefully employed here. Such Patent is incorporated herein, in full.

In one or more embodiments as described herein, a method and system for validating an integrated circuit design, built with encrypted silicon IP blocks, is provided, wherein DRC and LVS check, parasitic RC extraction, circuit simulation and other circuit validation checks, such as signal EM (Electro migration) and voltage drop check, SI (Signal Integrity) check and static timing check, etc. are performed.

In the following detailed description, references are made to the accompanying drawings that form a part hereof, and in which are shown by way of illustration specific embodiments or examples.

Figure 1:
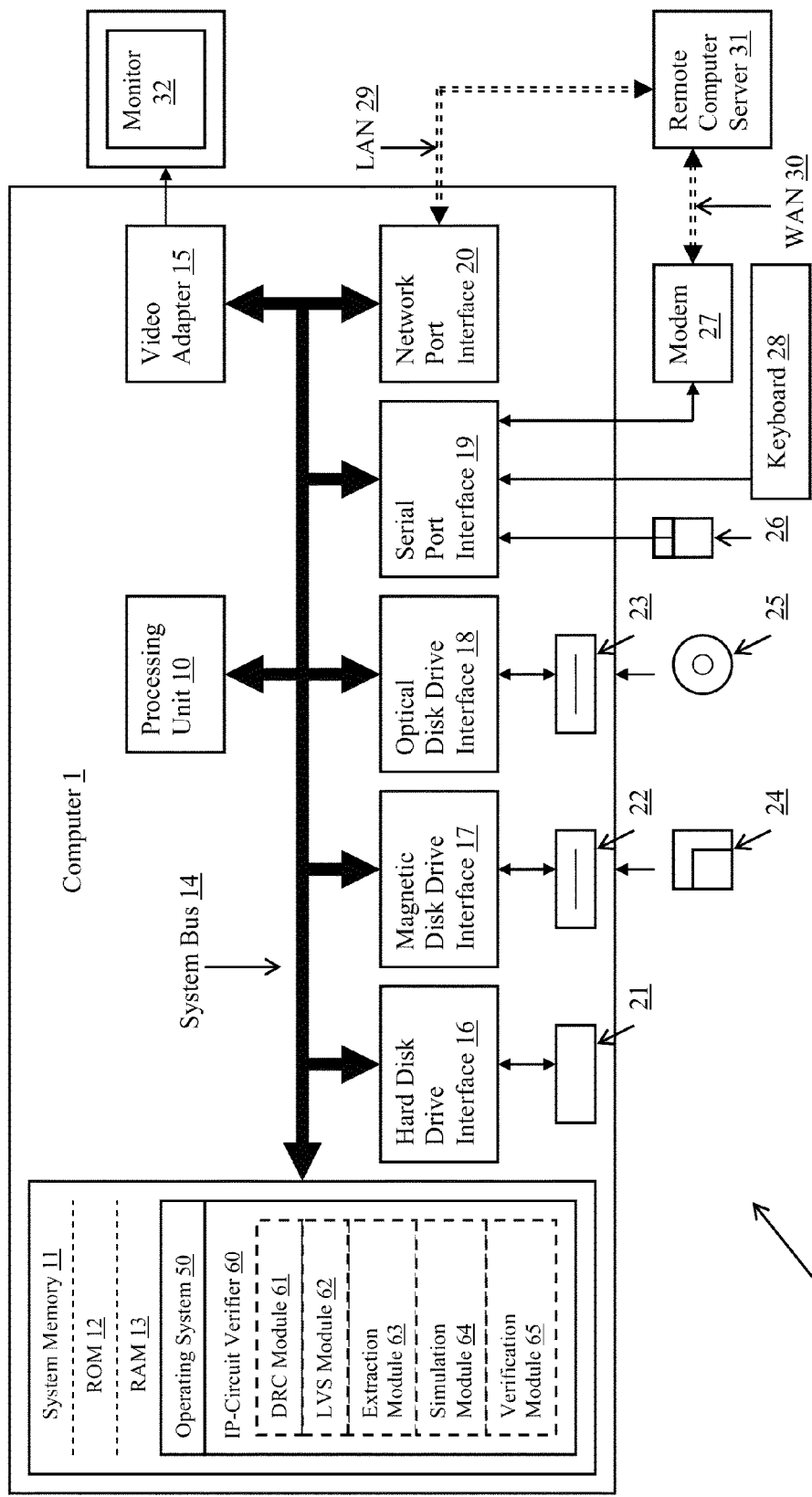
FIG. 1 is a functional block diagram of a typical computer system that can provide an operating environment for the present invention.

FIG. 1 represents a general purpose computer system or network 100 capable of hosting an IP circuit verifier 60 in a software application embodiment of the present invention. IP circuit verifier 60 is used to validate integrated circuit designs built with encrypted IP blocks, and is more fully detailed in connection with FIG. 2.

Those skilled in the art will appreciate that the present invention may be practiced in any type of computer system operating environment such as multiprocessor systems, microprocessor-based or programmable consumer electronics, minicomputer systems, mainframe computer systems, and the like. The present invention may also be practiced in distributed computing environments where tasks are performed by remote processing devices.

Computer system or network 100 includes a conventional computer system 1, including a processing unit 10, a system memory 11, and a system bus 14 that connects the computer system memory 11 to the processing unit 10. The computer system memory 11 includes read only memory (ROM) 12 and random access memory (RAM) 13. The computer system 1 further includes a hard disk drive 21, a magnetic disk drive 22, e.g., to read from or write to a removable disk 24, and an optical disk drive 23, e.g., for reading a CD-ROM disk 25 or to read from or write to other optical media. The hard disk drive 21, magnetic disk drive 22, and optical disk drive 23 are connected to the computer system bus 14 by a hard disk drive interface 16, a magnetic disk drive interface 17, and an optical drive interface 18, respectively. The drives and their associated computer system-readable media provide nonvolatile storage for the computer system 1. Although the description of computer system-readable media above refers to a hard disk, a removable magnetic disk and a CD-ROM disk, it should be appreciated by those skilled in the art that other types of media which are readable by a computer system, such as magnetic cassettes, flash memory cards, digital video disks, Bernoulli cartridges, and the like, may also be used in the exemplary operating environment.

In one or more exemplary embodiments, the functions described may be implemented in hardware, software, firmware, or any combination thereof. If implemented in software, the functions may be stored on or transmitted over as one or more instructions or code on a computer system-readable medium. Computer system-readable media includes both computer system storage media and communication media including any medium that facilitates transfer of a computer system program from one place to another. A storage media may be any available media that can be accessed by a computer system. Computer system-readable media can comprise RAM, ROM, EEPROM, CD-ROM or other optical disk storage, magnetic disk storage or other magnetic storage devices, or any other medium that can be used to carry or store program code in the form of instructions or data structures and which can be accessed by a computer system. Software or program code may be transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer system-readable media.

The computer system 1 uses an operating system 50 for execution of a suite of software embodiments of the present invention, e.g., a DRC module 61, a LVS module 62, an extraction module 63, a simulation module 64 and a verification module 65. DRC module 61 does design rule checking on an integrated circuit design built with encrypted silicon IP blocks. The LVS module 62 does layout versus schematic checking. The extraction module 63 does parasitic RC extraction. The simulation module 64 does circuit simulation. The verification module 65 does other validation checks, such as signal EM and voltage drop checking, SI checking and static timing checking, etc.

A user may enter commands and information into the computer system 1 through a keyboard 28 and pointing device, such as a mouse 26. Other input devices (not shown) may include a microphone, game pad, scanner, or the like. These and other input devices are often connected to the processing unit 10 through a serial port interface 19 that is coupled to the computer system bus 14, but may be connected by other interfaces, such as a universal serial bus (USB). A monitor 32 or other type of display device is also connected to the computer system bus 14 via an interface, such as a video adapter 15. In addition to the monitor, computer systems typically include other peripheral output devices (not shown), such as, without limitation, speakers or printers.

The computer system 1 may operate in a networked environment using logical connections to one or more remote computer systems, such as a remote computer system 31. The remote computer system 31 may be a server, a router, a peer device or other common network node, and typically includes many or all of the elements described relative to the computer system 1. The logical connections illustrated in FIG. 1 include a local area network (LAN) 29, denoted as a double dotted line, and a wide area network (WAN) 30, denoted as a double dotted line. Such networking environments are commonplace in offices, enterprise-wide computer system networks, intranets and the Internet.

When the computer system 1 is used in a LAN networking environment, the computer system 1 is connected to the LAN 29 through a network port interface 20. When the computer system 1 is used in a WAN networking environment, the computer system 1 may include a modem 27 or other means for establishing communications over the WAN 30, such as the Internet. The modem 27, which may be internal or external, is connected to the computer system bus 14 via the serial port interface 19. In a networked environment, program codes illustrated relative to the computer system 1, or portions thereof, may be stored in the remote computer system 31. It will be appreciated that the network connections shown are example and other means (wired or wireless) of establishing a communications link between the computer systems may be used. It will be further be appreciated that the present invention could equivalently be implemented on a client server network architecture other than a local computer system, and could equivalently be transmitted to the local computer system by means other than a CD-ROM, for example, by way of the network port interface 20.

Figure 2:
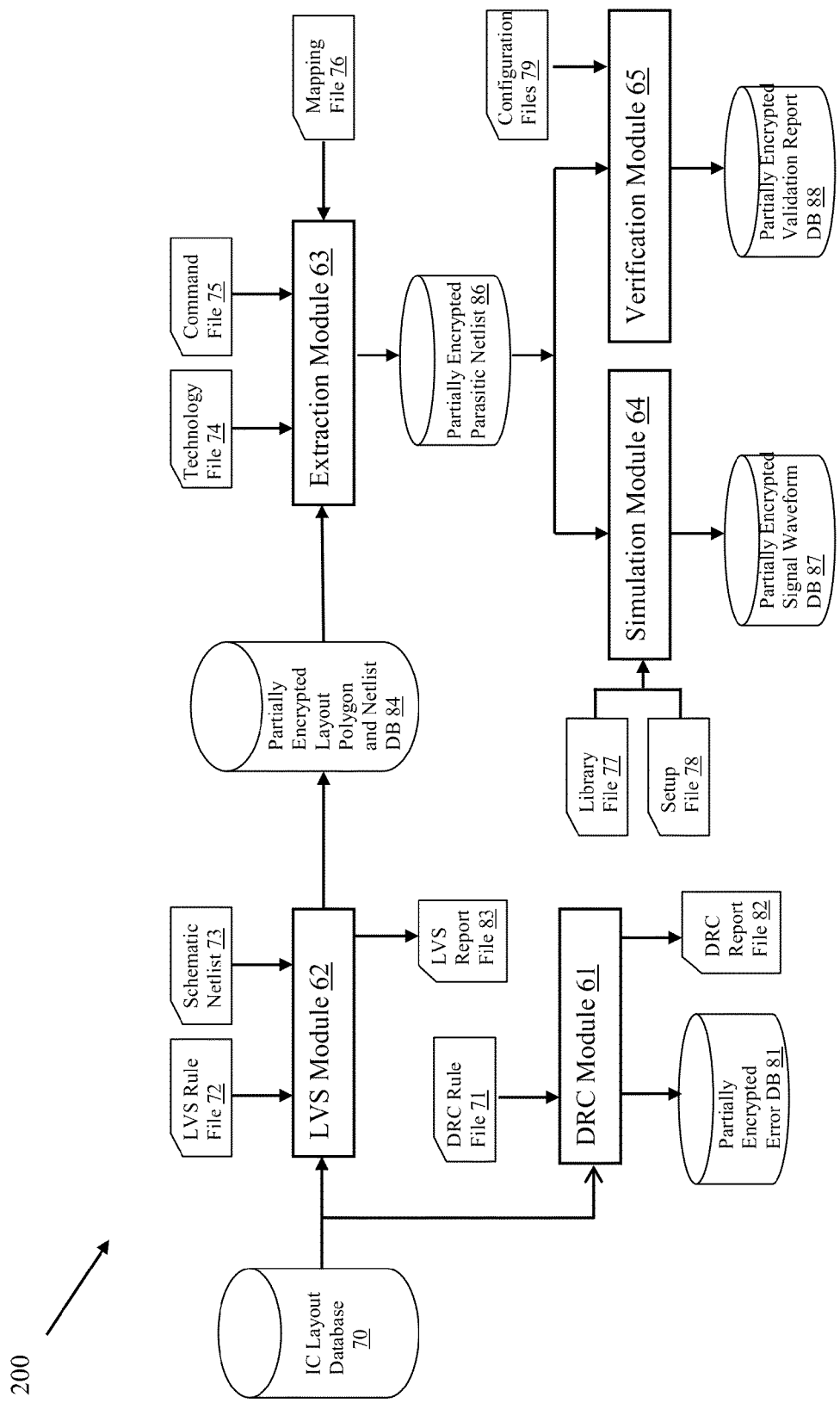
FIG. 2 is a functional block diagram, which shows an example architecture for validating an integrated circuit design built with encrypted silicon IP blocks in an embodiment of the present invention.

FIG. 2 represents a verification system 200 for validating IC layout database 70, representative of an integrated circuit design built with encrypted silicon IP blocks, in an embodiment of the present invention. The IC layout database 70 may be a GDSII file, OASIS file or other format layout database file.

DRC module 61 reads and parses the DRC rule file 71, then it reads in the IC layout database 70, then it decrypts the encrypted IP blocks found in the database 70 to get decrypted IP blocks, then it finds out polygons and texts on different layers from the decrypted IP blocks and from the other unencrypted blocks in the database 70, then it does design rule checks on the polygons and texts according to the rules defined in the DRC rule file 71, and creates violation shapes, finally it outputs the violation shapes to the partially encrypted error database 81 and creates the DRC report file 82.

LVS module 62 reads and parses the LVS rule file 72, then it reads in the IC layout database 70, then it decrypts the encrypted IP blocks found in the database 70 to get decrypted IP blocks, then it finds out polygons and texts on different layers from the decrypted IP blocks and from the other unencrypted blocks in the database 70, then it extracts pins, nets and devices from the polygons and texts according to the rules defined in the LVS rule file 72, then it builds up a layout netlist from the pins, nets and devices extracted, then it reads in the schematic netlist 73, finally it compares the layout netlist with the schematic netlist to create the LVS report file 83. For parasitic RC extraction purpose, LVS module 62 creates the partially encrypted layout polygon and netlist database 84 when it builds up the layout netlist.

The extraction module 63 reads and parses the command file 75, then it reads in the technology file 74 and the layer mapping file 76, then it reads and decrypts the partially encrypted layout polygon and netlist database 84 to get nets, devices and polygons, then it maps the layers of the polygons from layout layers to technology layers, then it extracts resisters and capacitors from the polygons on technology layers, finally it outputs the RC results and the nets and devices to the partially encrypted parasitic netlist 86.

The partially encrypted parasitic netlist 86 is the main input file for the simulation module 64 and the verification module 65. The simulation module 64 reads and parses the setup file 78, then it reads and decrypts the partially encrypted parasitic netlist 86 to get a circuit network, then it reads in the library file 77 to get the device models, finally it simulates the circuit network by applying input signals on the input pins of the circuits and propagating the signals through the circuit network, it creates waveforms on each nets in the circuit network and outputs the waveform results to the partially encrypted signal waveform database 87.

The verification module 65 reads the configuration files 79, then it reads and decrypts the partially encrypted parasitic netlist 86 to get a circuit network, then it does the validation checks on the circuit netlist, such signal EM and voltage drop check, SI check and static timing check, etc. Finally it outputs the checking results to the partially encrypted validation report files 88.

DRC module 61, LVS module 62, extraction module 63, simulation module 64 and verification module 65 may be implemented by user defined functions in C/C++ programming language. As known to those skilled in the art, other methods can be used to implement these functions without departing from the scope of the present invention. For example these functions may be implemented by user defined classes in any object oriented programming language or by any user defined script functions. The implementation of these functions of the DRC module 61, the LVS module 62, the extraction module 63, the simulation module 64 and the verification module 65 are shown in FIGS. 3-7 and will be described in greater detail below.

Figure 3:
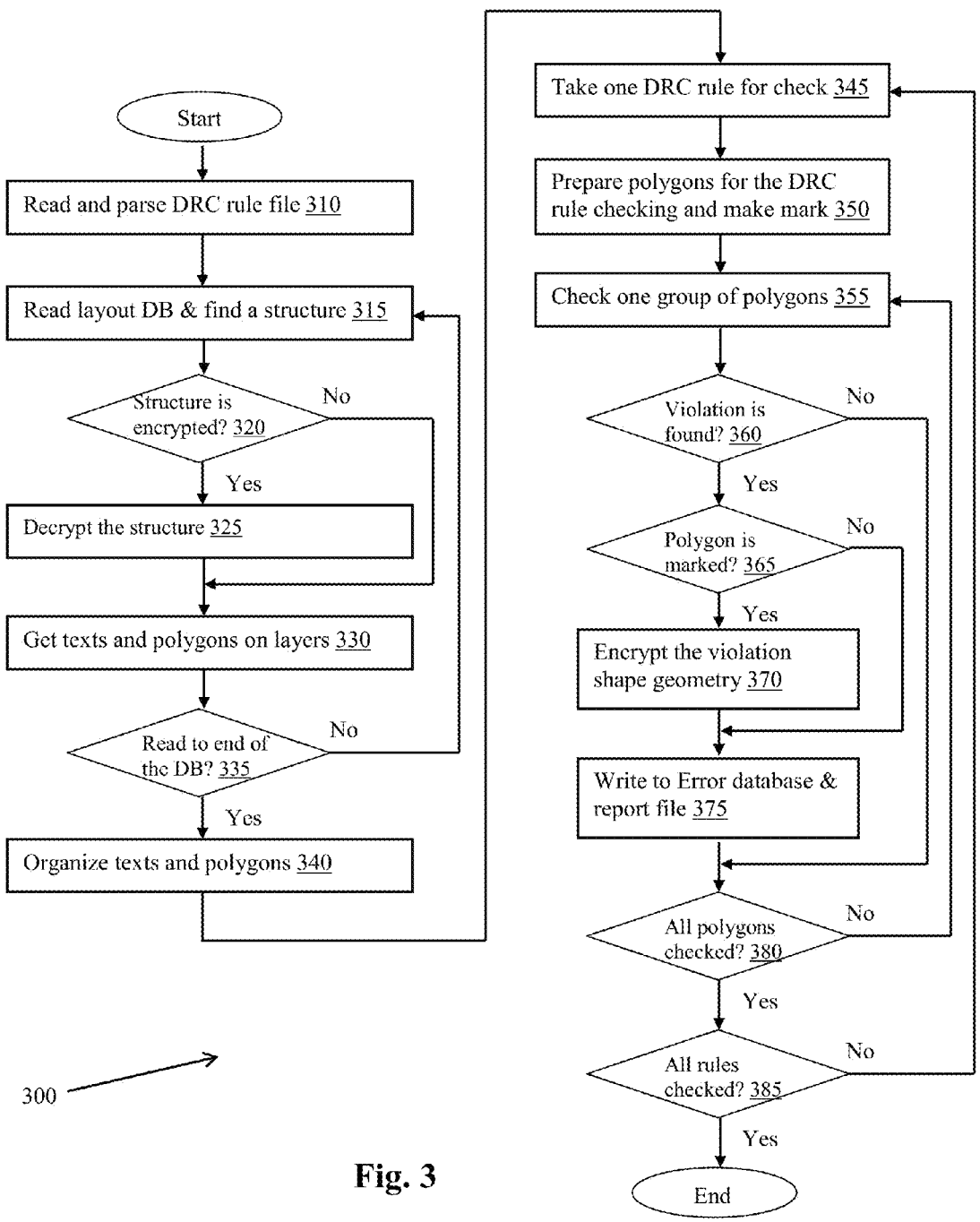
FIG. 3 is a flowchart diagram of the steps involved in design rule check on an integrated circuit design built with encrypted silicon IP blocks in an embodiment of the present invention.

FIG. 3 is a flowchart diagram of the steps involved in a DRC validating process 300 operating on an integrated circuit design built with encrypted silicon IP blocks in a preferred embodiment of the present invention. The DRC validating process 300 illustrated in FIG. 3 generally corresponds to DRC module 61 in FIG. 2. However, as those skilled in the art recognize, DRC module 61 in FIG. 2 may be implemented in other ways as well.

At the first step 310 of the DRC validating process 300 set forth in FIG. 3, the process reads and parses the DRC rule file 71 to get the layout database path, the primary layout cell name, layer definitions, connection definitions and design rule definitions, etc.

At step 315, the process opens the layout database from the path found at step 310, and sequentially reads in database records, from the records the process finds a structure. In U.S. Pat. No. 8,117,661, "Encryption based silicon IP protection", it disclosed the method in detail on how to parse a layout database to find the database records and structures.

If at step 320, the structure found from step 315 is encrypted, that means, the structure is an encrypted silicon IP block and is generated from an original layout database by using the innovative method disclosed in U.S. Pat. No. 8,117, 661 "Encryption based silicon IP protection", the process goes to step 325. Otherwise, the process goes to step 330. As known to those skilled in the art, other methods in future may also be used to encrypt an original layout database generating an encrypted silicon IP block, such as by creating a new type stream record specific to save the data got from any encryption process on the silicon IP database, or by creating an abstract IP layout and meanwhile utilizing a separate file besides the layout database file to save the encryption result of the silicon IP database, etc., those methods can also be utilized as conditions to check a structure whether or not is encrypted without departing from the scope of the present invention.

At step 325, the process decrypts the encrypted structure found at step 320 to get a decrypted layout database structure. In U.S. Pat. No. 8,117,661, "Encryption based silicon IP protection", it disclosed the method in detail on how to decrypt an encrypted silicon IP block to get its original design, and a cryptographic key from the IP provider is needed do the decryption. At step 330, the process gets the polygons and texts on different layers from the decrypted layout database structure and also from the unencrypted structure found at step 320. All the polygons and texts from the decrypted structure are marked as encrypted, so in later steps, the process knows these marked polygons and texts are from an encrypted structure in the layout database.

If at step 335, the process reads to the end of the layout database, it goes to step 340. Otherwise it loops back to step 315. At step 340, all the polygons and texts on different layers are organized and saved in a hierarchical data structure by following the hierarchy structures in the layout database. As known to those skilled in the art, it is mainly a performance consideration to arrange all the polygons and texts in a hierarchy order for processing. Without the current step 340, it does not depart from the scope of the present invention.

At step 345, the process selects one of the DRC rules found at step 310 for validation. According to chip fabrication process requirements, several aspects of a layer polygon shape need to be checked. Three of the most basic checks are single polygon width check, polygons spacing check and polygons enclosing space check. One example of polygons spacing check rule statement is listed as below.

"ExtSpace Layer 1 Layer2<0.01"

In the above rule statement, "ExtSpace" is the keyword for the spacing check. Layer 1 and Layer2 are a pair of layers, the outer space between them needs to be checked, and if their outer space is less than 0.01 micron, a DRC violation needs to be flagged and reported. As known to those skilled in the art, various DRC checks can be defined by text format statements similar to the above example, those statements can be easily parsed and their corresponding DRC checks can be performed without departing from the scope of the present invention.

At step 350, the polygon shapes of the checked layers in the selected DRC rule, such as Layer 1 and Layer2 in above example, are generated and saved in the memory. If the checked layers are original layout database layers, their polygon shapes can be collected from the results at step 330 with their encryption marks kept. If the checked layers are derived layers, that means, they are generated from Boolean equations of original database layers and/or other derived layers. Their polygon shapes need to be generated from the Boolean operations of the polygon shapes of the layers in the equation. If any polygon shapes in the Boolean operations have the encrypted mark already, the generated polygon shapes need to be marked as encrypted as well. As known to those skilled in the art, the polygon shapes of the checked layers may have geometry data on different hierarchy level. The different hierarchy level geometry data may need be flattened and transferred to upper level hierarchy geometry before any processing on them. Such an operation is not departing from the scope of the present invention.

At step 355, the process performs the selected rule check on one group of the polygons generated at step 350. For instance, in above spacing check example, one of the polygons for Layer 1 and one of the polygons for Layer2 is grouped and their outer space are checked with the value 0.01 micron. If at step 360, a violation of the selected rule is found, for example, the space between the two polygons grouped above is less than 0.01 micron, the process goes to step 365. Otherwise, the process goes to step 380. If at step 365, the violation of the selected rule is generated from a polygon with the encrypted mark, the process goes to step 370. Otherwise, the process goes to step 375. As known to those skilled in the art, scan-line algorithm is now commonly used when doing polygon shape and spacing check. A polygon can be separated to multiple edge sections according to its vertex geometries in X or in Y. Each edge sections is also marked with inside and outside directions. When doing polygon shape and spacing check, the edge sections are used to be checked instead of the polygon itself. For example, when doing the outer spacing check, the outside direction space of two edge sections is checked. When a violation found, either the shapes of two edge sections or the region shape between the two edge sections are outputted as the violation shapes. As known to those skilled in the art, other algorithms can also be used to do the polygon shape and spacing check without departing from the scope of the present invention.

Because the violation shapes may have the similar geometries as the polygon shapes in the layout database. To protect encrypted silicon IP blocks, at step 370, the process encrypts the violation shape to its encrypted format. When doing the encryption, the same cryptographic key to decrypt the silicon IP block or a separate cryptographic key is used. In a preferred embodiment of the present invention, the data of the violation shape geometries are saved in a data array. Then the data array is encrypted to a binary data array by using a public encryption algorithm with the cryptographic key. Finally the binary data array is mapped to a string of ASCII characters as its encrypted format. As known to those skilled in the art, other methods can also be used to transform the violation shapes to an encrypted format without departing from the scope of the present invention.

At step 375, the violation shapes are written to the partially encrypted DRC error database 81. For all the violation shapes transformed to its encrypted format at step 370, the characters in the encrypted format are written to the encryption section of the DRC error database 81. For other violation shapes, their geometry data is directly written to the none-encryption section of DRC error database 81. The encryption section violation shapes can be viewable only by decrypting them with the cryptographic keys from the providers of the encrypted silicon IP blocks. Also at step 375, the error shapes, the rule names and other related information of the violations are also written to the DRC report file 82, for violations, whose shapes are in their encrypted format, only none confidential information can be written to the report file for protecting the encrypted IP blocks in the layout database. As known to those skilled in the art, other methods can also be used to handle the output information without departing from the scope of the present invention.

If at step 380, all polygons generated at step 350 are checked with the selected rule, the process goes to step 385. Otherwise, the process goes back to step 355. If at steps 385, all DRC rules found at step 310 are checked, the process closes all the open files and exit. Otherwise, it goes back to step 345.

When doing design rule check on an integrated circuit design built with encrypted IP blocks, the validation process not only needs to find out all the violations, which include the violations in the encrypted silicon IP blocks, but also needs to protect the circuit design and other confidential information in the encrypted silicon IP blocks. The present invention has provided a method and system to meet both of the requirements. As known to those skilled in the art, other steps, algorithms and functions may also be used in the DRC validation flow to improve the features and performance of the process without departing from the scope of the present invention.

Figure 4:
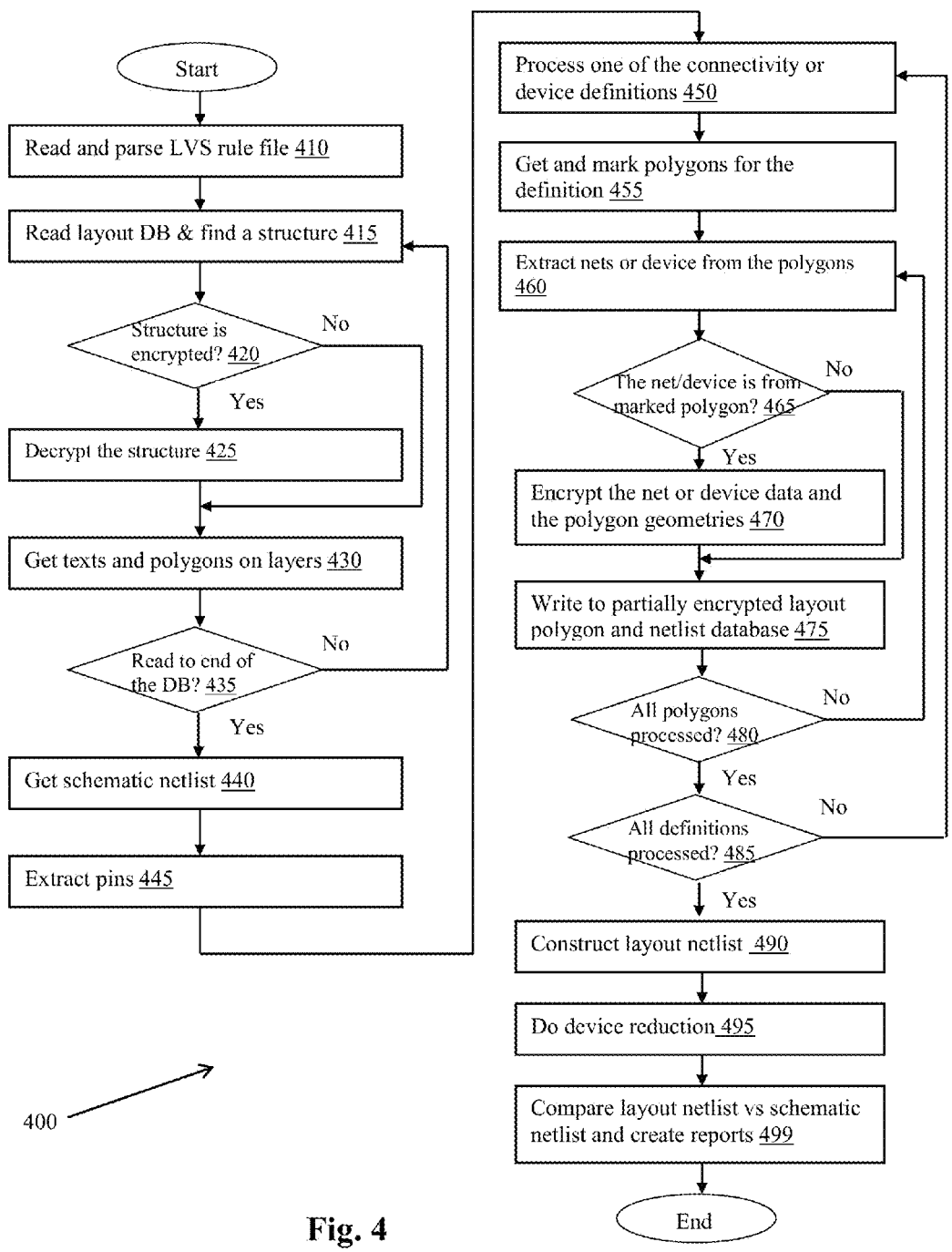
FIG. 4 is a flowchart diagram of the steps involved in LVS check on an integrated circuit design built with encrypted silicon IP blocks in an embodiment of the present invention.

FIG. 4 is a flowchart diagram of the steps involved in a LVS validating process 400 operating on an integrated circuit design built with encrypted silicon IP blocks in a preferred embodiment of the present invention. The LVS validating process 400 illustrated in FIG. 4 generally corresponds to the LVS module 62 illustrated in FIG. 2. However, as those skilled in the art recognize, the LVS module 62 shown in FIG. 2 may be implemented in other ways as well.

At the first step 410 of the LVS validating process 400 set forth in FIG. 4, the process reads and parses the LVS rule file 72 to get the layout database path, the primary layout cell (structure) name, the schematic netlist path, the primary schematic cell name, layer definitions, label definitions, connectivity definitions and device definitions, etc.

At step 415, the process opens the layout database from the path found at step 410, and sequentially reads in database records, from the records the process finds a structure.

If at step 420, the structure found from step 415 is encrypted, that means, the structure is an encrypted silicon IP block and is generated from an original layout database by using the innovative method disclosed in U.S. Pat. No. 8,117,661 "Encryption based silicon IP protection", the process goes to step 425. Otherwise, the process goes to step 430. As known to those skilled in the art, other methods in future may also be used to encrypt an original layout database generating an encrypted silicon IP block, those methods can also be utilized as conditions to check a structure whether or not is encrypted without departing from the scope of the present invention.

At step 425, the process decrypts the encrypted structure found at step 420 to get a decrypted layout database structure. In U.S. Pat. No. 8,117,661, "Encryption based silicon IP protection", it disclosed the method in detail on how to decrypt an encrypted silicon IP block to get its original design, and a cryptographic key from the IP provider is needed do the decryption. At step 430, the process gets the polygons and texts on different layers from the decrypted layout database structure and also from the unencrypted structure found at step 420. All the polygons and texts from the decrypted structure are marked as encrypted, so in later steps, the validating process 400 knows these marked polygons and texts are from an encrypted structure in the layout database.

If at step 435, the process reads to the end of the layout database, it goes to step 440. Otherwise it loops back to step 415.

At step 440, the process reads the schematic netlist file 73 from the path found at step 410. As known to those skilled in the art, the schematic netlist file 73 may also be encrypted for protecting the circuit netlist and other confidential information relating to the encrypted silicon IP blocks. The process decrypts the schematic netlist 73 and reads the result without departing from the scope of the present invention. In U.S. Pat. No. 8,117,661, "Encryption based silicon IP protection", it also disclosed a method to encrypt and merge a schematic netlist file into the encrypted silicon IP database, therefore the circuit netlists for the encrypted IP blocks can be decrypted and got from the encrypted silicon IP blocks. As known to those skilled in the art, this current step 440 can be performed at any step between step 410 and step 495 without departing from the scope of the present invention.

At step 445, from the primary (top) level layout cell, the process extracts pins from the polygons of the conductor layers, which are labeled by texts in the text layers. The conductor layers in general are layers declared in connectivity definitions found at step 310. And the text layers are used to label the corresponding conductor layers in the label definitions found at step 310. As known to those skilled in the art, this current step can be performed at any step between step 435 and step 485 without departing from the scope of the present invention.

At step 450, the process selects one of the connectivity definitions and the device definitions found at step 310 for processing. Because all the ports of each device are required to have connectivity, so the connectivity definitions in general are selected for processing before the device definitions. The connectivity definitions and device definitions are commonly written in text format in the LVS rule file 72. An example of one text statement of the connectivity definition and an example of one text statement of the device definition are listed as below.

A connectivity definition example:
"Connection Layer1 Layer2 by Layer3"
A device definition example:
"DeviceDef CapDev Layer4 Layer5 Layer6"

In the above connectivity definition example, "Connection" is the keyword to define the connectivity between different layers in the LVS rule file 72, and Layer1, Layer2 in this example are connected through Layer3.

In the above device definition example, "DeviceDef" is the keyword to define a device, CapDev is the device name, Layer4 is the device body layer name, Layer5 and Layer6 are the names of the port layers of the device.

As known to those skilled in the art, various connectivity and devices can be defined by text format statements similar to the above examples, those statements can be easily parsed and their corresponding definitions can be processed without departing from the scope of the present invention. Moreover, in order to extract necessary properties of a device, such as area, length and width, etc., extra text format statements may also need added into a device definition without departing from the scope of the present invention, and after extraction, the data of the properties is saved as part of the data of the device.

At step 455, the polygon shapes of the layers in the connectivity definition or device definition selected at step 450, such as Layer1, Layer2 and Layer3 or Layer4, Layer5 and Layer6 in above examples, are generated and saved in the memory. If those layers are original layout database layers, their polygon shapes can be collected from the results at step 430 with their encryption marks kept. If the layers are derived layers, that means, they are generated from Boolean equations of original database layers and/or other derived layers. Their polygon shapes need to be generated from the Boolean operations of the polygon shapes of the layers in those equations. If any polygon shapes in the Boolean operations have an encryption mark already, the generated polygon shapes need to be marked as encrypted as well.

At step 460, the process extracts nets or a device from the polygons generated at step 455. For instance, in above connectivity definition example, polygons for Layer1, Layer2 and Layer3 are separated to different groups, generally called as nets, by checking the geometry relationship between the polygons. If one polygon for Layer 1 (or Layer2) is overlapped or abutted by one polygon for Layer3, these two polygons are grouped as a net and are assigned with a unique net name when neither of them is assigned with a net name before. If either of the polygons has already had a net name, that means, at least one of the polygons has been already extracted to a net, one of the already assigned net name is chosen as the new net name and the two group polygons are merged into a single group (net) to share the new net name. Two polygons of the same layer are grouped as a net if they are overlapped or abutted, the process performs the merging operation on them as well. In above device definition example, if one polygon for Layer5 and one polygon for Layer6 both overlap or touch one polygon for Layer4, then a device is found and extracted with its device type assigned as CapDev. As known to those skilled in the art, various nets and devices can be extracted from the polygons on different layers by following the connectivity definitions and device definitions without departing from the present invention. When extracting nets and a device from the polygons, a polygon may be extracted as a net, and also be extracted as a pin of the circuit or a port of the device at the same time. Therefore the pin of the circuit or the port of the device is connected to the net. And at the end of extraction, through all the nets extracted, the pins of the circuit and ports of all the devices are connected together and a layout netlist can be built up.

If at step 465, the net or device is extracted from polygons with the encryption mark, the process goes to step 470. Otherwise, the process goes to step 475.

Because the data of the net or device extracted from the polygons and texts from the encrypted silicon IP blocks and the geometry data of their corresponding polygons are confidential. To protect encrypted silicon IP blocks, at step 470, the process encrypts the data of the net or device and the corresponding polygons' geometries to an encrypted format. When doing the encryption, the same cryptographic key to decrypt the encrypted silicon IP block or a separate cryptographic key is used. In a preferred embodiment of the present invention, the data of the net or device and the corresponding polygon's geometries are saved in a data array. Then the data array is encrypted to a binary data array by using a public encryption algorithm with the cryptographic key. Finally the binary data array is mapped to a string of ASCII characters as its encrypted format. As known to those skilled in the art, other methods can also be used to transform the data of the net or device and the geometry data of their corresponding polygons to an encrypted format without departing from the scope of the present invention.

At step 475, the data of the extracted nets or device and the corresponding polygon geometries are written to the partially encrypted layout polygon and netlist database 84, in which polygons and the nets or device have a data link reference to each other. For the data transformed to the encrypted format at step 470, the characters in the encrypted format are written to the encryption section of the partially encrypted layout polygon and netlist database 84. The other data is written to the none-encryption section of database 84. The encryption section data can be accessed only by decrypting it with the cryptographic key from the providers of the encrypted silicon IP blocks. As known to those skilled in the art, other methods can also be used to handle the data of extracted nets and devices to protect encrypted silicon IP blocks without departing from the scope of the present invention. Also as known to those skilled in the art, at step 465, step 470 and step 475, the process saves the nets and devices extracted from the integrated circuit design and their corresponding polygons to the partially encrypted layout polygon and netlist database 84 mainly to support the parasitic RC extraction process. For a mere LVS validation process, those steps can be skipped without departing from the scope of the present invention.

If at step 480, all polygons generated at step 455 are processed and extracted to nets or devices according to the selected connectivity definition or device definition, the process goes to step 485. Otherwise, the process goes back to step 460. If at steps 485, all connectivity definitions and device definitions found at step 410 are processed, the process goes to step 490. Otherwise, it goes back to step 450.

At step 490, the process constructs the layout netlist from the pins, nets and devices extracted at step 445 and step 460. The process starts from pins and uses nets to connect all the pins and all the ports of devices together to create the layout netlist. As known to those skilled in the art, the layout netlist can be saved in a flatten mode, that means, when doing extraction, all polygons' geometries are mapped to upper structure level geometries, therefore the final layout netlist is flattened on the upper structure level, or the layout netlist can be saved in a hierarchy mode by following the hierarchy structure of the integrated circuit design. Both the processing methods and/or their combinations do not depart from the scope of the present invention.

At step 495, all parallel or serial connected same type devices are merged to a single device for the circuit reduction purpose, while keeping the equivalence of the circuit functions. For instance, multiple parallel connected capacitor devices can be reduced to a single capacitor device, the capacitance value of the single capacitor device is the sum of the capacitance values of the replaced capacitor devices. As known to those skilled in the art, various circuit reduction methods or algorithms can be utilized to simplify both the layout netlist and the schematic netlist without departing from the scope of the present invention.

At step 499, the process compares the layout netlist and the schematic netlist and output the compare result to the LVS report file 83. The comparing operation can start from the pins of the circuit and compare through the whole netlist by following the net connections. Any mismatch of the pins, nets and devices between the netlists is recorded in the report file 83. For the mismatches of the pins, nets and devices extracted from the polygons and texts from the encrypted silicon IP blocks, their data is encrypted and saved in the encryption section of the report file 83, only summarized error messages are written to the report file 83 to state there are mismatch errors in the encrypted silicon IP blocks. As known to those skilled in the art, either deep-first search algorithm or the breadth-first search algorithm can be used when comparing the netlists. To improve the performance of LVS validation check, the process usually performs the comparison in a hierarchy mode by following the hierarchy structures in the circuit design.

When doing LVS check on an integrated circuit design built with encrypted IP blocks, the validation process not only needs to find out all the mismatches between the layout and the schematic design, but also needs to protect the circuit design and other confidential information in the encrypted silicon IP blocks. The present invention has provided a method and system to meet both of the requirements. As known to those skilled in the art, other steps, algorithms and functions may also be used in the LVS validation flow to improve the features and performance of the process without departing from the scope of the present invention.

Figure 5:
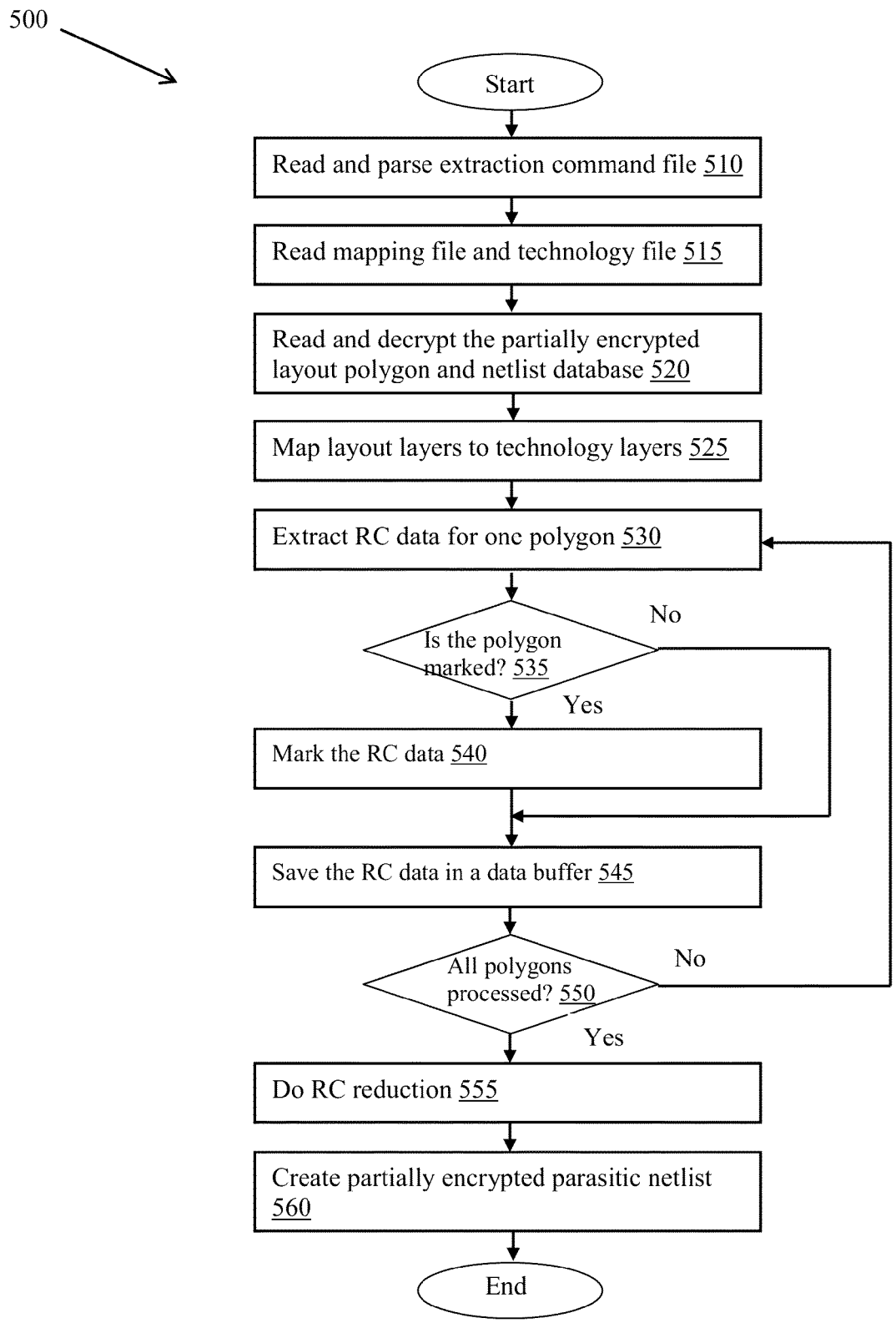
FIG. 5 is a flowchart diagram of the steps involved in parasitic RC extraction on an integrated circuit design built with encrypted silicon IP blocks in an embodiment of the present invention.

FIG. 5 is a flowchart diagram of the steps involved in a parasitic RC extraction process 500 in a preferred embodiment of the present invention. The parasitic RC extraction process 500 illustrated in FIG. 5 generally corresponds to the extraction module 63 illustrated in FIG. 2. However, as those skilled in the art recognize, the extraction module 63 shown in FIG. 2 may be implemented in other ways as well.

The process flow 500 begins at step 510 where the process reads and parses the extraction command file 75 to get the primary cell name, the layer mapping file path, the technology file path and the layout polygon and netlist database path, etc.

At step 515, the process reads the layer mapping file and the technology file from the paths found at step 510. In the layer mapping file, each layout layer saved in the layout polygon and netlist database is mapped to a technology layer. In the technology file, the technology layers are used to define the physical layer structures for a certain fabrication technology from the bottom substrate layer up to the top metal layer.

At step 520, the process reads the partially encrypted layout polygon and netlist database 84 from the path found at step 510, the process decrypts the encryption section of the database 84 with cryptographic keys from the providers of the encrypted silicon IP blocks, or with a common cryptographic key shared by the providers. After decryption, the process reads data of polygons on layout layers, circuit nets, circuit devices and data links between polygons and nets from the database 84. The polygons, nets and devices, data of which is decrypted from the encryption section, are marked as encrypted.

At step 525, the process maps the layers of polygons from layout layers to technology layers by following the layer mapping table defined by the layer mapping file.

At step 530, the process extracts resistors and capacitors from one of the polygons mapped to technology layers. Before extraction, the polygon is divided to several segments by its connection points with other polygons and/or the nearby conductor polygon segments with which a coupling capacitor is considered and extracted. In a preferred embodiment of the present invention, when extracting a resistor from a polygon segment, following formula is generally used to define its value.

$$R=Rs*L/W$$

Rs is the sheet resistance value of the technology layer gotten from the technology file, L is the length of the polygon segment, while W is the width of the polygon segment.

When extracting capacitors for a polygon segment, there are generally three different type capacitors to be extracted. First, it is an overlap capacitor between the polygon segment and an overlapped polygon segment below it on a different technology layer, the overlap capacitor value is defined as, $Ca=Pa*A$, Pa is the capacitance value per area and is gotten from the technology file, and A is the overlapped area value. Second, it is a lateral capacitor between the polygon segment and another polygon segment on the same technology layer, the lateral capacitor value is defined as $Ct=Pt*L$, Pt is the capacitance value per length, L is the length of the parallel section between the segments. Third, it is a fringe coupling capacitor between the sidewall of the polygon segment and a polygon segment below it on a different technology layer, the fringe capacitor value is defined as, $Cn=Pn*L$, Pn is the capacitance value per length, L is the length of the parallel section between the polygon segments. As known to those skilled in the art, various methods and algorithms, balancing between the accuracy and performance of the extraction, can be used to extract RC from a polygon without departing from the scope of the present invention. Among them, field solver solutions generally provide the highest accuracy, while formula based and look-up table based solutions generally provide the highest performance.

If at step 535, the resistors and capacitors are extracted from a polygon marked as encrypted, the process goes to step 540, otherwise the process goes to step 545. At step 540, the resistors and capacitors extracted at step 530 are marked as encrypted. At step 545, the data of the resistors and capacitors are saved in an internal data buffer.

If at step 550, all the polygons, the layers of which are mapped from layout layers to technology layers at step 525, are processed, the process goes to step 555, otherwise the process loops back to step 530.

For each circuit net read at step 520, there are several polygons linked to the net. And when doing the extraction, the process divides each of the polygons to several polygon segments, then the process extracts a resistor and several capacitors from each of the polygon segments. So after extraction, there is a complicated RC network extracted for the circuit net. In an preferred embodiment of the present invention, at step 555, the process merged the resistors and capacitors in the RC network to a single resistor with a lump sum resistance value of the merged resistors and a single capacitor with a lump sum capacitance value of the merged capacitors for reducing the complicity of the RC network. As known to those skilled in the art, more advanced models and algorithms can be used to reduce the RC network, and this current step can also be skipped to keep the complicated RC network as the input source for some circuit validation processes, such as Signal EM and Voltage drop check, without departing from the scope of the present invention.

At step 560, the process combined the resistors and capacitors after reduction with the circuit nets and circuit devices found at step 520 by adding a resistor device on the net and adding a capacitor from the net to the ground signal, the process outputted the result to the partially encrypted parasitic netlist 86. To protect the circuit netlist related to the encrypted silicon IP blocks, the process encrypts the data of the circuit devices and nets marked as encrypted and the data of RC for the nets to an encrypted format. When doing the encryption, the same cryptographic key to decrypt the encrypted silicon IP block or a separate cryptographic key is used. In a preferred embodiment of the present invention, the data of the circuit devices and nets marked as encrypted and the data of RC for the nets is saved in a data array. Then the data array is encrypted to a binary data array by using a public encryption algorithm with the cryptographic key. Finally the binary data array is mapped to a string of ASCII characters as its encrypted format. As known to those skilled in the art, other methods can also be used to transform the data to its encrypted format without departing from the scope of the present invention. The characters in the encrypted format are written to the encryption section of the parasitic netlist 86, and can be accessed only by decrypting them with the cryptographic keys from the providers of the encrypted silicon IP blocks When doing the parasitic RC extraction on an integrated circuit design built with encrypted IP blocks, the process not only needs to extract the RC network from the layout database of the circuit, but also needs to protect the circuit design and other confidential information in the encrypted silicon IP blocks. The present invention has provided a method and system to meet both of the requirements. As known to those skilled in the art, other steps, algorithms and functions may also be used in the parasitic RC extraction flow to improve the accuracy and performance without departing from the scope of the present invention.

Figure 6:
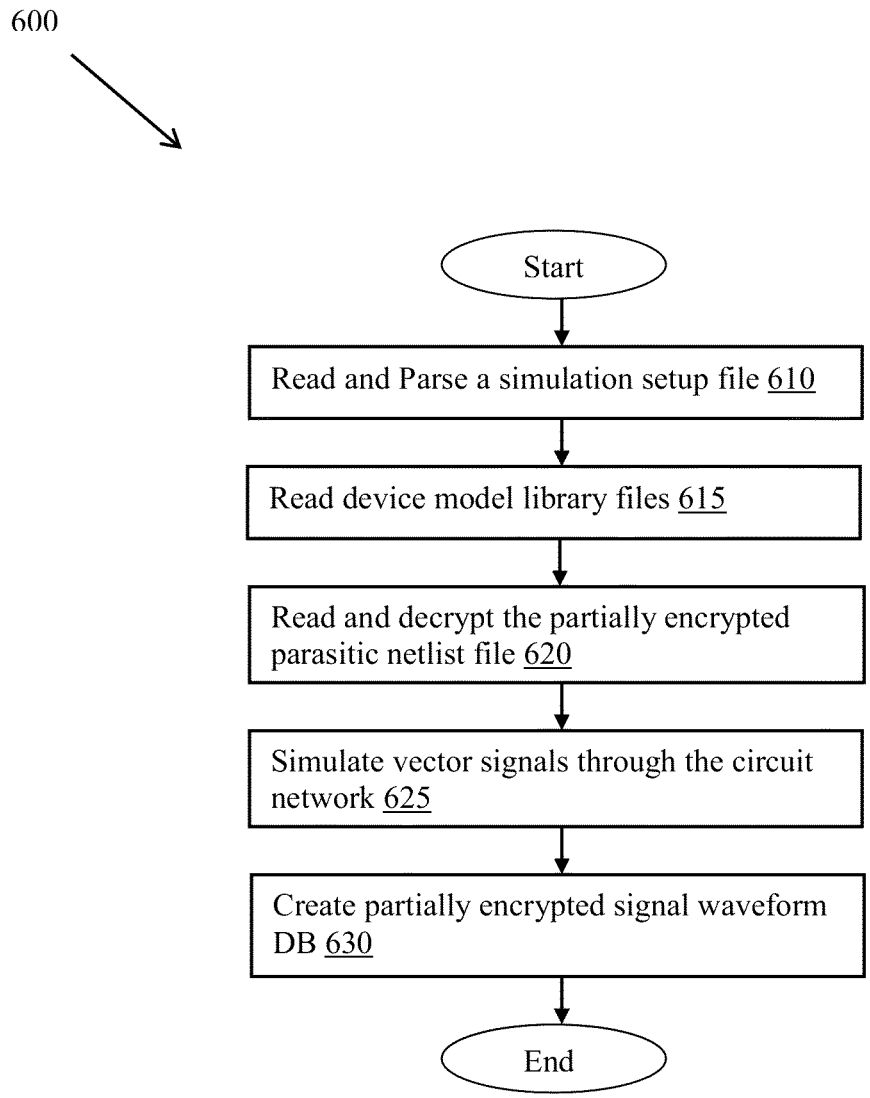
FIG. 6 is a flowchart diagram of the steps involved in circuit simulation on an integrated circuit design built with encrypted silicon IP blocks in an embodiment of the present invention.

FIG. 6 is a flowchart diagram of the steps involved in a circuit simulation process 600 in a preferred embodiment of the present invention. The circuit simulation process 600 illustrated in FIG. 6 generally corresponds to the simulation module 64 illustrated in FIG. 2. However, as those skilled in the art recognize, the simulation module 64 shown in FIG. 2 may be implemented in other ways as well.

The process flow 600 begins at step 610 where the process reads and parses the simulation setup file 78 to get the device model library paths, the parasitic netlist path, the simulation frequency setting, the simulation temperature setting, the simulation corner setting and the input signals, etc.

At step 615, the process reads the partially encrypted parasitic netlist 86 from the path gotten at step 610, the process decrypts the encryption section of the netlist 86 with the cryptographic keys from the providers of the encrypted silicon IP blocks, or with a common cryptographic key shared by the providers, then the process gets a circuit network consisting of nets, devices, resistors and capacitors on the nets from the netlist 86 after decryption. All circuit devices, nets, resistors, capacitors decrypted from the encryption section of the netlist 86 are marked as encrypted, therefore the simulation process 600 knows to protect the waveform data for the marked nets and devices when creating the waveform database.

At step 620, the process reads device model libraries from the paths gotten at step 610. As known to those skilled in the art, various device models are defined in the model libraries, such as transistor models, combined Ebers-Moll and Gummel-Poon bipolar models, JFET models, and models for resistors, capacitors, inductors, diodes, etc. Calculating with the device models, the simulation process can simulate the function and behavior of the devices by applying input signals on the input ports of the devices and generating output signals from the output ports of the devices.

At step 625, the process applies the input signals on the input pins of the circuit, the process calculate signals with the RC delay model and the device models and propagate calculated signals through the whole circuit network, and records the signal electric status changes (waveforms) of input/output pins of each device and the signal waveforms of the input/output pins of the circuit. The process first initializes the circuit network, assigns initial electric statuses for the pins of the circuits and the ports of the devices in the circuit network, then the process checks any signal electric status changes on the input pins of the circuit. Whenever there is a change on an input pin, through the RC nets connected to the pin, the process calculates with a RC delay model to create a signal electric status change on the input ports of devices, which are connected by the same RC nets. The signal electric status change on an input port of a device in turn triggers the process to calculate with the device model to get the signal electric status on the output port of the same device. If the signal electric status on the output port is not changed, the signal change propagation is stopped. Otherwise the process will continue the signal change propagation through the nets connected to the output port until an output pin of the circuit is reached. The process defines the simulation step period by following the simulation frequency setting gotten at step 610. At each step, the process saves the signal electric status changes (waveforms) of all the devices' pins and the circuit's pins in the memory. As known to those skilled in the art, other algorithm and method can also be used to simulate a circuit network without departing from the present invention. For example, SPICE (Simulation Program with Integrated circuit design Emphasis) is a general-purpose, open source analog electronic circuit simulator. It is a powerful program that is used in integrated circuit design and board-level design to check the integrity of circuit designs and to predict circuit behavior.

At step 635, the process flow 600 outputs the signal waveforms gotten at step 630 to the partially encrypted signal waveform database 87. For all the signal waveforms related to the circuit devices and nets marked as encrypted, the process encrypts the data of the waveforms to an encrypted format and saved each character of the encrypted format to the encryption section of the database 87. And the data saved in the encryption section of the database 87 can be viewable only by decrypting them with cryptographic keys from the providers of the silicon IP blocks.

Figure 7:
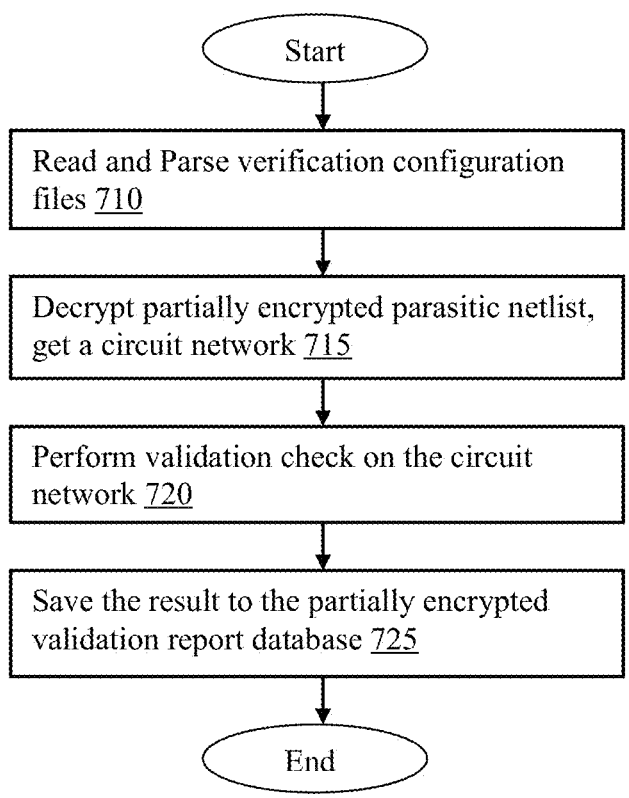
FIG. 7 is a flowchart diagram of the steps involved in other verification checks on an integrated circuit design built with encrypted silicon IP blocks in an embodiment of the present invention.

FIG. 7 is a flowchart diagram of the steps involved in a circuit validation process 700 in an preferred embodiment of the present invention. The circuit validation process 700 illustrated in FIG. 7 generally corresponds to the verification module 65 illustrated in FIG. 2. However, as those skilled in the art recognize, the verification module 65 shown in FIG. 2 may be implemented in other ways as well.

The process flow 700 begins at step 710 where the process reads and parses the configuration files 79 to get the parasitic netlist path.

At step 715, the process reads the partially encrypted parasitic netlist 86 from the path gotten at step 710, the process decrypts the encryption section of the netlist 86 with the cryptographic keys from the providers of the encrypted silicon IP blocks, or with a common cryptographic key shared by the providers, then the process gets a circuit network consisting of nets, devices, and resistors and capacitors on the nets from the netlist 86 after decryption. All circuit devices, nets, resistors, capacitors decrypted from the encryption section of the netlist 86 are marked as encrypted. As known to those skilled in the art, for some validation process, such as the signal EM and voltage drop check, the process reads a none reduction RC network from the netlist 86, decrypts and reads layout polygons from the layout polygon and netlist database 84, reads a circuit netlist from the schematic netlist 73, then does RC back annotation on the circuit netlist without departing from the scope of the present invention.

At step 720, the process performs various validation checks on the circuit network gotten at step 715, such as Signal EM and Voltage Drop check, SI check and static timing check, etc. When doing signal EM and voltage drop check, there are generally two different methods, one is dynamic method, the other is static method.

The dynamic method applies input signals on the input pins of a circuit, simulates the interconnect of the circuit to obtain time-varying current waveforms for each interconnect segment, based on which, average, RMS and peak current values are easily computed. The static method calculates the charge transfer through interconnect segments of a circuit by solving a system of linear equations. In public published papers, such as "A practical approach to static signal electromigration analysis" by N. S. Nagaraj and F. Cano, "Static Electromigration Analysis for Signal Interconnects" by Chanhee Oh and David Blaauw, the method and algorithm is described in detail. Signal Integrity (SI) check addresses two concerns in the design circuit, one is timing, the other is the quality of the signal, is to ensure reliable high-speed data transmission in the circuit. The timing problems can be easily identified at the logic level by using static timing analysis (STA) on the parasitic netlist. The general approach of static timing analysis has three main steps, first the parasitic netlist is broken into sets of timing paths, second the signal propagation delay along each path is calculated, third violations of timing constraints are checked and reported, that means, each path from its startpoint to its endpoint should be constrained by the definition of the period of the clock and the timing characteristics of the inputs and outputs of the circuit. Most of the signal quality problems of a design circuit are electromagnetic problems, such as reflection, crosstalk and ground bounce, which can be checked by circuit simulators. As known to those skilled in the art, the circuit simulators use one or more of the following methods to find the SI problems, such as Boundary Element Method (BEM), Finite Difference Timing Domain Method (FDTD), Finite Element Method (FEM) and Partial Element Equivalent Circuit (PEEC), without departing from the scope of the present invention.

At step 725, the process flow 700 outputs the validation results to the partially encrypted validation report database 88. For all the validation results related to the circuit devices and nets marked as encrypted, the process encrypts the data of the results to an encrypted format and saved each character of the encrypted format to the encryption section of the database 88. And the data saved in the encryption section of the database 88 can be viewable only by decrypting them with cryptographic keys from the providers of the silicon IP blocks.

Figure 8:
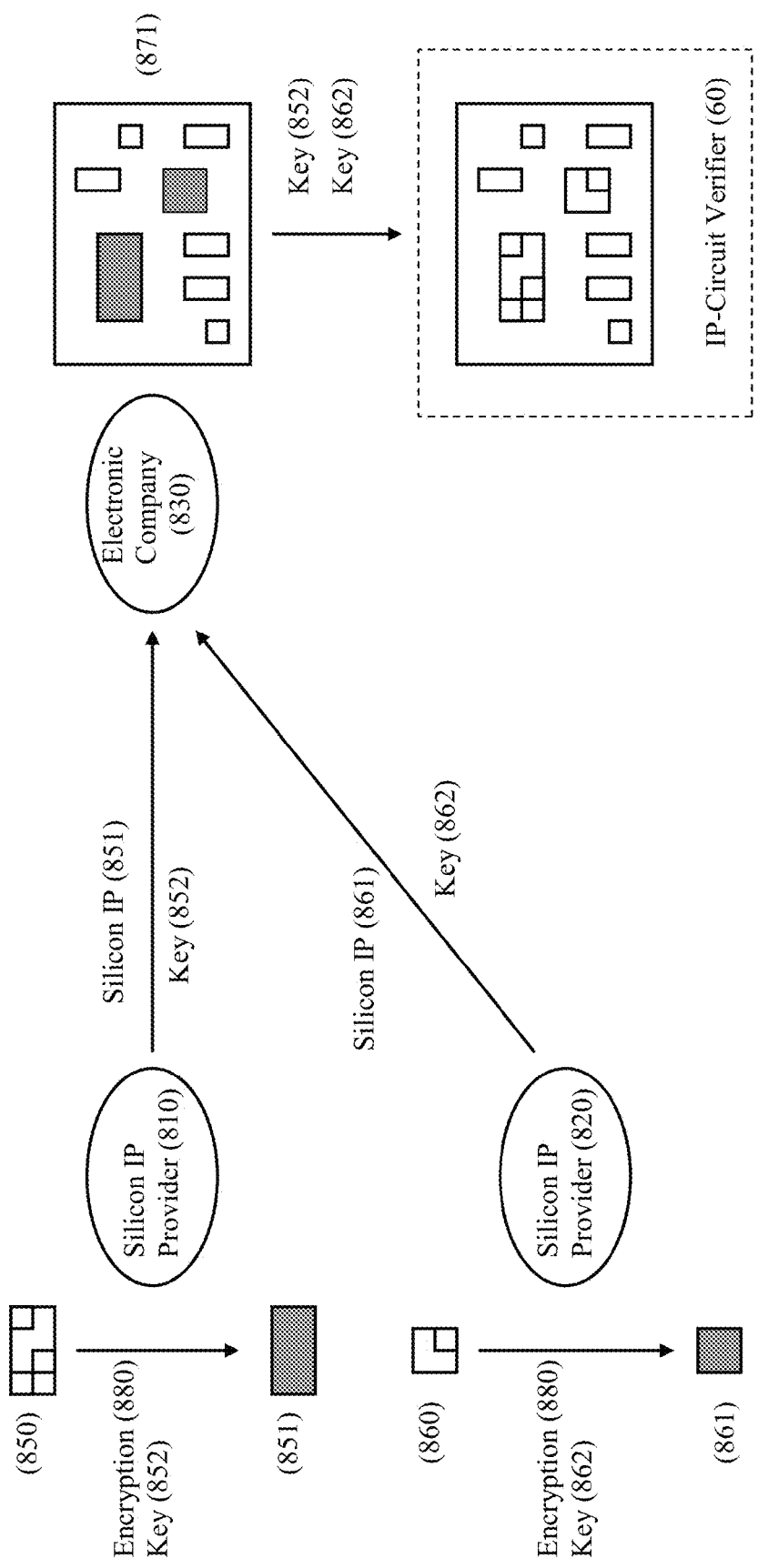
FIG. 8 is a diagram, which shows an encrypted silicon IP usage and verification flow with utilizing the present invention.

FIG. 8 is a block diagram 800 showing an encrypted silicon IP usage and verification flow with utilizing the present invention.

A first silicon IP provider 810 creates an original silicon IP layout database 850. The provider 810 then runs the encryption software tool 880, which implements the silicon IP encryption method disclosed by U.S. Pat. No. 8,117,661, "Encryption based silicon IP protection", with a cryptography key 852 to encrypt the layout database 850 and create an encrypted silicon IP layout database 851.

A second silicon IP provider 820 creates an original silicon IP layout database 860. The provider 820 then runs the encryption software tool 880, which implements the silicon IP encryption method disclosed by U.S. Pat. No. 8,117,661, "Encryption based silicon IP protection", with a cryptography key 862 to encrypt the layout database 860 and create an encrypted silicon IP layout database 861. While two silicon IP providers 810 and 820 are shown in FIG. 8, it is contemplated that any number of silicon IP providers may be involved in the encrypted silicon IP usage and verification flow 800.

An electronic company 830 desiring to create a circuit design 871, using one or more silicon IPs, acquires the silicon IPs layout database 851 and 861 from the silicon IP providers 810 and 820. The electronic company 830 then incorporates the silicon IPs layout database 851 and 861 into the circuit design 871. When the electronic company 830 wants to do circuit validation check on the circuit design 871, the electronic company 830 sends requests to the silicon IP providers 810 and 820 to ask for the verification keys. When the silicon IP providers 810 and 820 get the request and confirm the electronic company 830 is a legal user, they send the verification keys 852 and 862 to the electronic company 830. The electronic company 830 then passes the keys to the IP-circuit Verifier 60 to do the circuit validation.

In view of the foregoing, it will be appreciated that the present invention provides a method and system for validating integrated circuit designs built with encrypted silicon IP blocks and establishing a low cost usage and verification platform for silicon IP products. While the present invention has been particularly shown and described with reference to example embodiments thereof, it will be understood by those skilled in the art that various other changes in the form and details may be made therein without departing from the spirit and scope of the present invention.

What is claimed is:

1. A method of validating integrated circuit designs built with encrypted silicon IP blocks comprising:
a computer system comprising a processor, a memory, and a bus connecting said memory to said processor;
said processor parsing a design rule check (DRC) rule file;
said processor reading an integrated circuit design layout database;
said processor finding encrypted structures (said encrypted silicon IP blocks) and unencrypted structures from said integrated circuit design layout database;
said processor decrypting said encrypted structures to get decrypted structures;
said processor extracting polygons and texts from said decrypted structures and said unencrypted structures;
said processor performing design rule checks on said polygons and said texts and finding rule violations based on a scan-line algorithm; and
said processor writing said rule violations to a partially encrypted violation database, and when writing, said rule violations generated from said polygons and said texts from said decrypted structures are encrypted and saved in an encryption section of said partially encrypted violation database.

2. A method of validating integrated circuit designs built with encrypted silicon IP blocks comprising:
a computer system comprising a processor, a memory, and a bus connecting said memory to said processor;
said processor parsing a layout versus schematic (LVS) rule file;
said processor reading an integrated circuit design layout database;
said processor finding encrypted structures (said encrypted silicon IP blocks) and unencrypted structures from said integrated circuit design layout database;
said processor decrypting said encrypted structures to get decrypted structures;
said processor extracting polygons and texts from said decrypted structures and said unencrypted structures;
said processor extracting pins, nets, and devices from said polygons and said texts to get a layout netlist;
said processor reading a schematic netlist;
said processor comparing said layout netlist with said schematic netlist and recording mismatches of said pins, said nets, and said devices between said layout netlist and said schematic netlist; and
said processor writing said mismatches to report files, and when writing, said mismatches of said pins, said nets, and said devices in said layout netlist and extracted from said polygons and said texts from said decrypted structures, are encrypted and saved in an encryption section of said report files.

3. The method of claim 2, further comprising the steps of:
said processor saving said polygons and said texts, said pins, said nets, and said devices to a partially encrypted layout polygon and netlist database, and when saving, said polygons and said texts from said decrypted structures, and the said pins, said nets, and said devices extracted from said polygons and said texts from said decrypted structures, are encrypted and saved in an encryption section of said partially encrypted layout polygon and netlist database.

4. The method of claim 2, further comprising the steps of:
said processor parsing an extraction command file;
said processor reading a layer mapping file and a technology file;
said processor reading and decrypting said partially encrypted layout polygon and netlist database to get said pins, said nets, said devices, said polygons, and said texts;
said processor marking said pins, said nets, said devices, said polygons, and said texts decrypted from said encryption section of said partially encrypted layout polygon and netlist database;

said processor mapping said polygons and said texts from layout layers to technology layers;

said processor extracting resistors and capacitors from said polygons and said texts; and said processor merging said resistors and said capacitors with said pins, said nets, and said devices to build a circuit netlist, writing said circuit netlist to a partially encrypted parasitic netlist, and when writing, said marked pins, said nets, said devices, and said resistors and said capacitors extracted from said marked polygons and said marked texts are encrypted and saved in said encryption section of said partially encrypted parasitic netlist.

5. The method of claim 4, further comprising the steps of:
said processor parsing a simulation setup file;
said processor reading model library files to get device models;
said processor marking said pins, said nets, said devices, said resistors, and said capacitors decrypted from said encryption section of said partially encrypted parasitic netlist;
said processor simulating input signals through said circuit netlist and creating signal waveforms; and
said processor writing said signal waveforms to a partially encrypted signal waveform database, and when writing, the signal waveforms generated for said marked pins, said marked nets, and said marked devices, are encrypted and saved in said encryption section of said partially encrypted signal waveform database.

6. The method of claim 4, further comprising the steps of:
said processor parsing validation configuration file;
said processor reading and decrypting said partially encrypted parasitic netlist to get a circuit netlist built with said pins, said nets, said devices, said resistors, and said capacitors;
said processor marking said pins, said nets, said devices, said resistors, and said capacitors decrypted from the encryption section of said partially encrypted parasitic netlist;
said processor validating said circuit netlist and recording violations; and
said processor writing said violations to a partially encrypted violation report database, and when writing, said violations generated for said marked pins, said marked nets, and said marked devices, are encrypted and saved in said encryption section of said partially encrypted violation report database.

7. The method of claim 6, wherein validating said circuit netlist includes a signal electro migration (EM) and voltage drop checking, a signal integrity (SI) checking, and a static timing checking.

8. A computer system for validating integrated circuit designs built with encrypted silicon IP blocks comprising:
a computer system comprising a processor, a memory, and a bus connecting said memory to said processor;
Means for parsing a design rule check (DRC) rule file;
Means for reading an integrated circuit design layout database;
Means for finding encrypted structures (said encrypted silicon IP blocks) and unencrypted structures from said integrated circuit design layout database;
Means for decrypting said encrypted structures to get decrypted structures;
Means for extracting polygons and texts from said decrypted structures and said unencrypted structures;
Means for performing design rule checks on said polygons and said texts and finding rule violations; and
Means for writing said rule violations to a partially encrypted violation database, and when writing, said rule violations generated from said polygons and said texts from said decrypted structures, are protected.

9. A computer system of validating integrated circuit designs built with encrypted silicon IP blocks comprising:
a computer system comprising a processor, a memory, and a bus connecting said memory to said processor;
Means for parsing a layout versus schematic (LVS) rule file;
Means for reading an integrated circuit design layout database;
Means for finding encrypted structures (said encrypted silicon IP blocks) and unencrypted structures from said integrated circuit design layout database;
Means for decrypting said encrypted structures to get decrypted structures;
Means for extracting polygons and texts from said decrypted structures and said unencrypted structures;
Means for extracting pins, nets and devices from said polygons and said texts to get a layout netlist;
Means for reading a schematic netlist;
Means for comparing said layout netlist with said schematic netlist and recording mismatches of said pins, said nets, and said devices between said layout netlist and said schematic netlist; and
Means for writing said mismatches to report files, and when writing, said mismatches of said pins, said nets, and said devices in said layout netlist, and extracted from said polygons and said texts from said decrypted structures, are protected.

10. The computer system of claim 9, further comprising the steps of:
Means for saving said polygons, said texts, said pins, said nets, and said devices to a layout polygon and netlist database, and when saving, said polygons and said texts from said decrypted structures, and said pins, said nets, and said devices extracted from said polygons and said texts from said decrypted structures, are protected.

11. The computer system of claim 9, further comprising the steps of:
Means for parsing an extraction command file;
Means for reading a layer mapping file and a technology file;
Means for reading and decrypting said partially encrypted layout polygon and netlist database to get said pins, said nets, said devices, said polygons, and said texts;
Means for marking said pins, said nets, said devices, said polygons, and said texts decrypted from said encryption section of said partially encrypted layout polygon and netlist database;
Means for mapping said polygons and texts from layout layers to technology layers;
Means for extracting resistors and capacitors from said polygons and said texts; and
Means for merging said resistors and said capacitors with said pins, said nets, and said devices to build a circuit netlist, and writing said circuit netlist to a parasitic netlist, and when writing, said marked pins, said marked nets, said marked devices, said resistors and said capacitors extracted from said marked polygons and said marked texts, are protected.

12. The computer system of claim 11, further comprising the steps of:

Means for parsing a simulation setup file;

Means for reading model library files to get device models;

Means for reading and decrypting said partially encrypted parasitic netlist to get a circuit netlist built with said pins, said nets, said devices, said resistors, and said capacitors;

Means for marking said pins, said nets, said devices, said resistors, and said capacitors decrypted from said encryption section of said partially encrypted parasitic netlist;

Means for simulating input signals through said circuit netlist and creating signal waveforms; and Means for writing said signal waveforms to a signal waveform database, and when writing, said waveforms generated for said marked pins, said marked nets, and said marked devices, are protected.

13. The computer system of claim 11, further comprising the steps of:

Means for parsing a validation configuration file;

Means for reading and decrypting said partially encrypted parasitic netlist to get a circuit netlist built with said pins, said nets, said devices, said resistors, and said capacitors;

Means for marking said pins, said nets, said devices, said resistors, and said capacitors decrypted from said encryption section of said partially encrypted parasitic netlist;

Means for validating said circuit netlist and recording violations; and

Means for writing said violations to a violation report database, and when writing, said violations generated for said marked pins, said marked nets, and said marked devices, are protected.

14. The computer system of claim 13, wherein the means for validating said circuit netlist includes means for checking signal electro migration (EM) and voltage drop, means for checking signal integrity (SI), and means for checking static timing.

15. A method for using and verifying encrypted silicon IP, comprising:

a network system comprising multiple computer systems located at silicon IP providers and electronic companies, each computer system having a processor, a memory, and a bus connecting said memory to said processor;

said processor located at least at one silicon IP provider creating an encrypted layout database from an original IP layout database using a cryptographic key;

said processor located at an electronic company receiving said encrypted silicon IP layout database from said at least one silicon IP provider;

said processor located at said electronic company incorporating said encrypted silicon IP layout database of at least one silicon IP provider into a circuit design; and said processor located at said electronic company validating said circuit design using cryptographic keys for said encrypted silicon IP layout database.

16. The method of claim 15, further comprising:

said processor located at said electronic company, before validation, requesting said cryptographic keys from said at least one silicon IP provider;

said processor located at said at least one silicon IP provider confirming that said electronic company is a legal user and communicating said cryptographic key to said electronic company; and said processor located at said electronic company passing said cryptographic key to a circuit verification tool to perform a circuit validation.

17. The method of claim 16, wherein said circuit verification tool performs a design rule check (DRC), a layout versus schematic (LVS) check, a parasitic RC extraction, a circuit simulation, a signal electro migration (EM) and voltage drop check, a signal integrity (SI) check, and a static timing check.

* * * * *